US006818932B2

(12) United States Patent
Nii et al.

(10) Patent No.: US 6,818,932 B2
(45) Date of Patent: Nov. 16, 2004

(54) SEMICONDUCTOR DEVICE WITH IMPROVED SOFT ERROR RESISTANCE

(75) Inventors: Koji Nii, Tokyo (JP); Motoshige Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/003,404

(22) Filed: Dec. 6, 2001

(65) Prior Publication Data

US 2002/0130344 A1 Sep. 19, 2002

(30) Foreign Application Priority Data

Mar. 13, 2001 (JP) ....................................... 2001-070921

(51) Int. Cl.[7] .......................... H01L 29/76; H01L 29/94

(52) U.S. Cl. ....................... 257/288; 257/368; 257/401; 257/410; 257/411; 257/412; 257/413

(58) Field of Search ................................ 257/368, 401, 257/409, 410, 411, 413, 403, 774, 784, 672, 675, 288, 412, 503; 438/672, 675

(56) References Cited

U.S. PATENT DOCUMENTS

| | | | | |
|---|---|---|---|---|
| 5,656,841 A | | 8/1997 | Watanabe et al. | |
| 6,169,308 B1 | * | 1/2001 | Sunami et al. | 257/321 |
| 6,190,953 B1 | * | 2/2001 | Igarashi et al. | 438/197 |
| 6,299,314 B1 | * | 10/2001 | Igarashi et al. | 1/1 |
| 6,472,701 B2 | * | 10/2002 | Yaegashi et al. | 257/296 |

FOREIGN PATENT DOCUMENTS

| | | | |
|---|---|---|---|
| JP | 61-168265 | | 7/1986 |
| JP | 363213965 | * | 9/1988 |
| JP | 8-125137 | | 5/1996 |
| JP | 3064999 | | 5/2000 |

* cited by examiner

*Primary Examiner*—Minhloan Tran
*Assistant Examiner*—Tan Tran
(74) *Attorney, Agent, or Firm*—Burns, Doane, Swecker & Mathis, L.L.P.

(57) ABSTRACT

There is provided a semiconductor device including a transistor formed by means of a common contact hole that connects a gate electrode, and a diffused layer forming a source/drain terminal; and a semiconductor device comprising the gate electrode of the transistor, and a connecting terminal to which capacitance between substrates and capacitance between the gate electrode and the source/drain terminal are added, thereby improving the soft error resistance caused by alpha rays and neutron beams.

14 Claims, 15 Drawing Sheets

SEMICONDUCTOR DEVICE WITH IMPROVED SOFT ERROR RESISTANCE

BACKGROUND OF THE INVENTION

1. Field of the Invention

The present invention relates to a semiconductor device having improved soft error resistance.

2. Description of the Prior Art

First of all, assume the case of electrically connecting a source/drain that is an impurity-diffused layer and a gate electrode wiring existing on a separating area. Herein, the source drain is formed with an impurity-diffused layer having a conduction type opposite to that of the silicon substrate (or the well area). The gate electrode wiring is often formed with polysilicon.

An electrical connection is usually performed by opening a contact hole on a portion of the gate electrode wiring on the separating area and another contact hole on a portion of the diffused layer, individually, followed by covering these contact holes in common with a metal such as aluminum or tungsten. In that case, such an electrical conduction is achieved by opening one common contact hole across the above-mentioned gate electrode wiring and the diffused layer, followed by covering the contact hole with the metal, rendering a smaller occupied area.

FIG. 30 and FIG. 31 are respectively a plan view and a sectional view taken along line I—I of FIG. 30, which show the structure of a common contact hole described in JP-A 61/168265(1986) of the prior art. FIGS. 30 and 31 show a well area 10, a diffused layer 20, a gate electrode 30, an interlayer film or dielectric 50, and a common contact hole 60. This common contact hole 60 has a structure in which the gate electrode 30 and the diffused layer 20 corresponding to source/drain are situated at some distance to prevent their overlapping. This is to avoid a problem that the gate electrode 30 and the substrate 10 may be shorted by passing the gate electrode 30 through the thin gate oxide film under the gate electrode when the gate electrode 30 extends onto the silicon substrate. Actually, a sidewall of $SiO_2$ is provided in an isolation portion between the gate electrode 30 and diffused layer 20 in order to avoid the short between the gate electrode 30 and the substrate. However, this structure is not illustrated in FIGS. 30 and 31 for simplicity.

Japanese Patent No. 3,064,999 illustrates the structure of a common contact hole when a silicide layer and a gate sidewall are adopted. The structure is devised to place the center of the common contact hole 60 in the central position of the gate sidewall in order to increase positional margin or accuracy against mask dislocations.

JP-A 08/125137(1996) describes the example in which a resistor is inserted in the common contact hole in order to reduce soft-error.

Since a conventional semiconductor device is configured as mentioned above, with the microfabrication of memory cells, there appears manifestly a soft-error problem that the data held in memory nodes could be inverted by external causes such as alpha rays emitted from a package or electrons generated by neutron beams from space. Especially, the malfunction has become serious as the power supply voltage decreases.

As a countermeasure for increasing soft error resistance, there is a method of decreasing the inversion of memory data brought by the external cause by increasing a capacitance of a memory node (referred to as critical charge). However, in the method, there are drawbacks such as increase of area and cost-up because of required additional processes in order to create the capacitance.

SUMMARY OF THE INVENTION

The present invention has been accomplished to solve the above-mentioned problems, and is directed to a semiconductor device that has a small cell size and improved soft-error resistance.

First, the present invention provides a semiconductor device, comprising:

a gate electrode formed on a substrate through a gate insulating film lying therebetween; a first and a second diffused layers formed opposed to each other across the portion of the substrate existing under the gate electrode and having a first conduction type, each having a second conduction type different from the first conduction type of the portion; a wiring layer formed above the gate electrode; a contact hole formed between the wiring layer and the substrate; and a semiconductor device, comprising:

a gate electrode formed on a substrate through a gate insulating film lying therebetween; a first and a second diffused layers formed opposed to each other across the portion having a first conduction type of the substrate under the gate electrode, each having a conduction type different from the first conduction type of the portion; a wiring layer formed above the gate electrode; and a contact formed within a contact hole between the wiring layer and the substrate, which connects the wiring layer to the first diffused layer and the gate electrode.

Herein, the contact may be connected also to the second diffused layer.

In addition, the semiconductor device comprises a third diffused layer formed on the substrate, and an isolation area formed between the first and the third diffused layers, which separates the first and the third diffused layers each other; and the contact may be connected further to the third diffused layer.

Second, the present invention provides a semiconductor device, comprising: a gate electrode formed on a substrate through a gate insulating film; a diffused layer formed on the substrate; a wiring layer formed above the gate electrode; and a contact formed within a contact hole between the wiring layer and the substrate, which connects the wiring layer to the diffused layers and the gate electrode; wherein the diffused layer has: a first and a second portions formed opposed to each other across the portion of the substrate existing under the gate electrode and having a first conduction type, each having a second conduction type different from the first conduction type of the portion of the substrate; and a third portion that connects the first portion to the second portion.

Herein, the contact may be connected to the first and the second portions of the diffused layer.

In addition, the semiconductor device comprises another diffused layer formed on the substrate, and an isolation area formed between the diffused layer and the other diffused layer, which separates the diffused layer and the other diffused layer; and the contact may be connected further to the other diffused layer.

The semiconductor device comprises a SRAM cell, and the wiring layer may be connected to the memory node of the SRAM cell.

The semiconductor device comprises a bistable trigger circuit, and the wiring layer may be connected to the memory node of the bistable trigger circuit.

The semiconductor device comprises another gate electrode formed on the substrate through another gate insulating film, and a transistor for composing a semiconductor integrated circuit (IC) therein; and the film thickness of the gate insulating film may be thinner than the one of the other gate insulating film.

The semiconductor device comprises another gate electrode formed on the substrate through another gate insulating film, and a transistor for composing a semiconductor IC therein; and the relative dielectric constant of the gate insulating film may be higher than the one of the other gate insulating film.

The semiconductor device comprises a source area and a drain area formed opposed to each other across the channel portion of the substrate existing under the gate electrode, and a transistor for composing a semiconductor IC therein; and the impurity concentrations of the first and the second diffused layers may be higher than the ones of the source and the drain areas.

The semiconductor device comprises a source area and a drain area formed opposed to each other across the channel portion of the substrate existing under the gate electrode, and a transistor for composing a semiconductor IC therein; and the impurity concentration of the diffused layer may be higher than the ones of the source and the drain areas.

DETAILED DESCRIPTION OF THE PREFERRED EMBODIMENTS

An embodiment of the present invention will be described below.

Embodiment 1.

Figure 1:
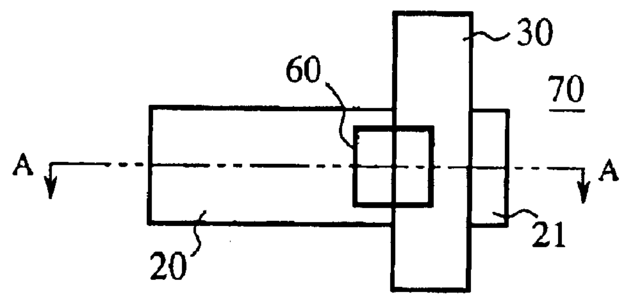
FIG. 1 is a plan view showing the structure of a common contact hole of the present invention.
Figure 2:
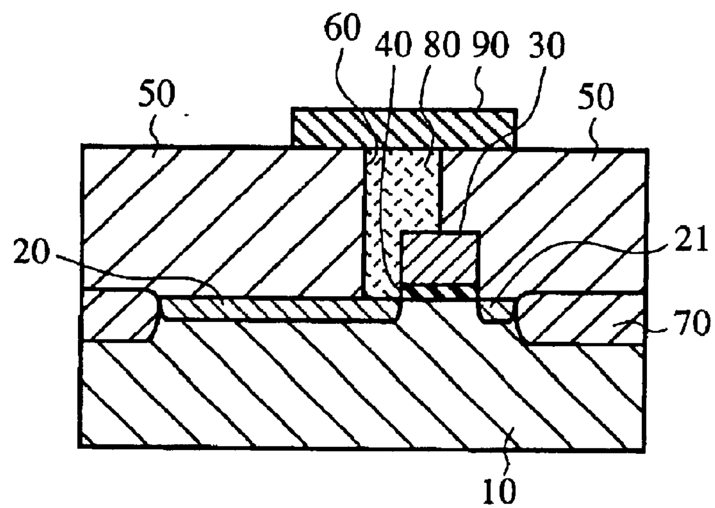
FIG. 2 is a sectional view taken along line A—A of FIG. 1.
Figure 3:
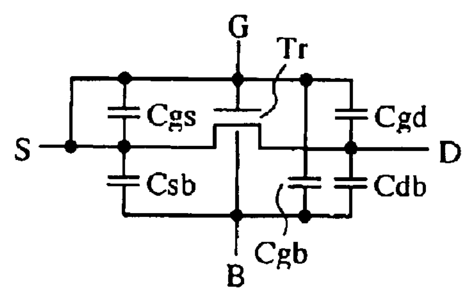
FIG. 3 is an equivalent circuit diagram thereof.

FIG. 1 is a plan view showing the structure of a common contact hole of the present invention. FIG. 2 is a sectional view taken along line A—A of FIG. 1. FIG. 3 is an equivalent circuit diagram thereof. FIGS. 1–3 show an well area (substrate) 10, first and second diffused layers 20, 21, a gate electrode (electrode wiring) 30, a gate insulating film 40, an interlayer film or dielectric 50, a contact hole 60, and an isolation area 70. In addition, when the above-mentioned well area 10 is of p type, the diffused layers 20 and 21 formed in the surface area is of n type; when the well area 10 is of n type, the diffused layers 20 and 21 is of p type.

The plan view of FIG. 1 will first be described. The device area separated by the isolation area 70 in a silicon substrate or well area 10 is formed, and gate electrode 30 fabricated with polysilicon and so on is formed such that the electrode extends from isolation area 70 to divide the device area into two sections. Thus, a transistor Tr is formed in a portion where the gate electrode 30 and the device area overlap one another. The impurity-diffused layers 20 and 21 are created by implanting an impurity having a conduction type opposite to that of the well area 10 (substrate). The simple contact hole 60 (common contact hole) is opened such that the hole spans the gate electrode 30 and diffused layer 20.

The sectional view of FIG. 2 will next be described. The first and second diffused layers 20 and 21 are formed on the well area 10, separated by the isolation area 70. The bottom surface of the gate electrode 30 is electrically insulated from the well area 10 through the thin insulating film 40 lying therebetween. After the interlayer film 50 is formed such that the film covers the first and second diffused layers 20, 21, isolation area 70, and gate electrode 30, the common contact hole 60 is opened such that the hole spans the electrode 30 and first diffused layer 20. Covering this common contact hole 60 with a contact 80 such as aluminum or tungsten enables the electrical connection among gate electrode 30, diffused layer 20, and wiring layer 90 formed over the top surface of interlayer film 50.

The equivalent circuit diagram of FIG. 3 will next be described. Since the transistor Tr is formed in the portion where the gate electrode 30 and the device area overlap one another, the gate electrode 30, first and second diffused layers 20, 21, and well area 10 correspond to gate terminal G, source terminal S. drain terminal D, and substrate B of the transistor, respectively. The gate terminal G and source terminal S are electrically connected with the metal which covers the common contact 80. A parasitic capacitance exists between these terminals by coupling. That is, there are a capacitance Cgs drain between gate and source, a capacitance Cgd between gate and drain, a capacitance Cgb between gate and substrate, a capacitance Csb between source and substrate, and a capacitance Cdb between drain and substrate. Note that since the source terminal S and drain terminal D correspond to the impurity-diffused layers 20 and 21 which have the same structure, respectively, these terminals do not need to be especially distinguished.

Referring to the equivalent circuit of FIG. 3, the thinner gate insulating film 40, the larger the capacitance Cgb between gate and substrate to be added can be obtained. However, there arises a problem that a leakage current flowing between the gate and the substrate may increase when the gate insulating film 40 is made too thin. A typical transistor has a drawback that a delay time may be increased as the gate capacitance increases.

Figure 32:
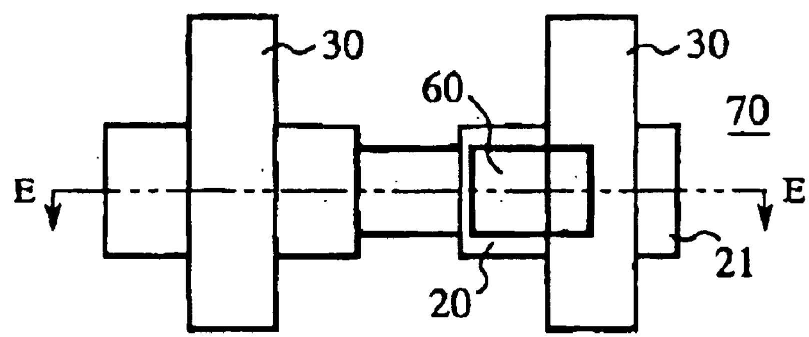
FIG. 32 is a plan view showing the structure of a common contact hole and another gate electrode.
Figure 33:
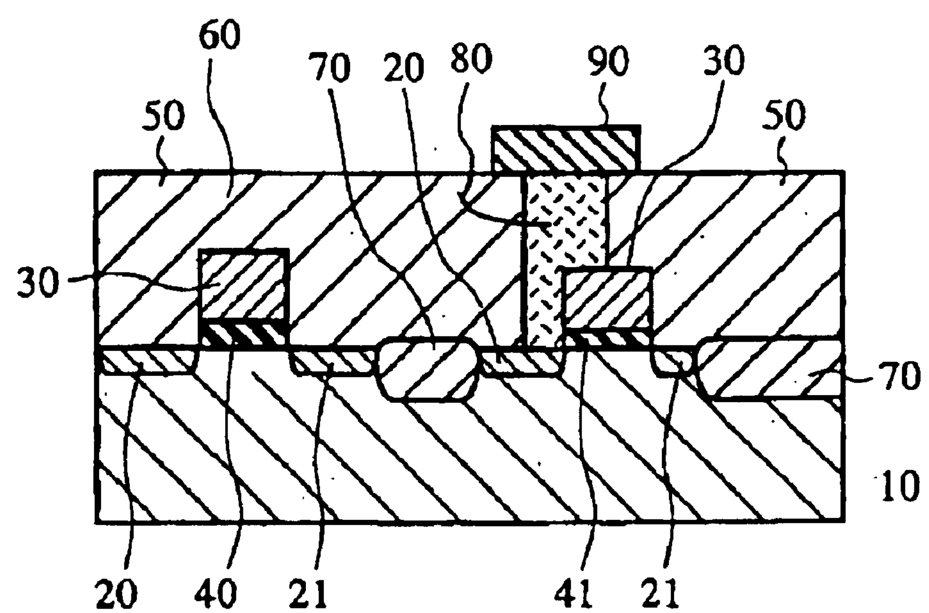
FIG. 33 is a sectional view taken along line E—E in FIG. 32.

Therefore, only the film thickness of the gate insulating film 40 in the common contact hole may be reduced as compared to that of the gate insulating film of the other typical transistors (see FIG. 32 and 33). Moreover, the gate insulating film 40 may be formed with a waterial having a high dielectric constant. The relative dielectric constant of gate insulating film 40 formed with normal silicon oxide $SiO_2$ is about 3.8. Examples of a material having a higher relative dielectric constant than 3.8 are titanium oxide and tantalum oxide. Since the capacitance Cgb between gate and substrate is proportional to the relative dielectric constant of the insulating film 40, the additional capacitance may be increased by applying the insulating film 40 having a high dielectric constant only for the common contact 80 portion.

Additionally, the impurity concentration of the impurity-diffused layer forming the common contact hole 60 may be increased. Since increasing the impurity concentration increases the junction capacitance, the capacitance Csb between source and substrate and the capacitance Cdb between drain and substrate can be increased.

As mentioned above, according to Embodiment 1, when connecting the gate electrode 30 and the diffused layer 20, since it is possible to perform these electrical connection through a metal covering the common contact hole 60, the number of contacts can be reduced and the space can be thereby reduced. In addition, since forming the transistor Tr under the common contact hole 60 enables the addition of the parasitic capacitance between the terminals of the transistor Tr to the connecting terminal, there exists an advantage that the capacitance element can be simultaneously formed.

Moreover, there exists an advantage that reducing the film thickness of only the gate insulating film 40 within the common contact hole 60 not only can increase the additional capacitance, but also can suppress the increases of the leakage current and of the delay of the transistor for switching.

In addition, there exists the advantage that using the material having a high dielectric constant only to the insulating film 40 within the common contact hole 60 not only can increase the additional capacitance, but also can suppress the increase of the delay of the transistor for switching.

In addition, there exists the advantage that increasing the impurity concentration of the first diffused layer 20 within the common contact hole 60 not only can increase the additional capacitance, but also can suppress the increase of the delay of the transistor for switching.

Embodiment 2.

Figure 4:
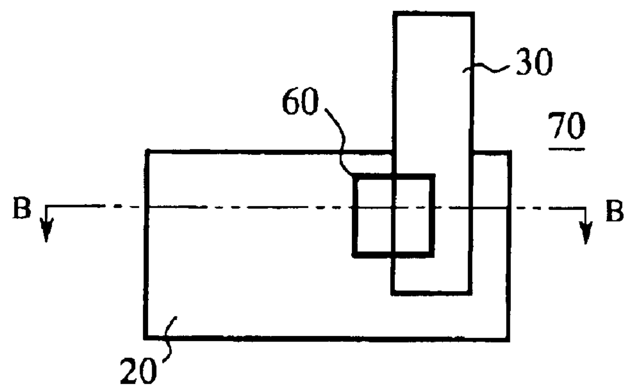
FIG. 4 is a plan view showing the structure of a common contact hole 60 of Embodiment 2 of the present invention.
Figure 5:
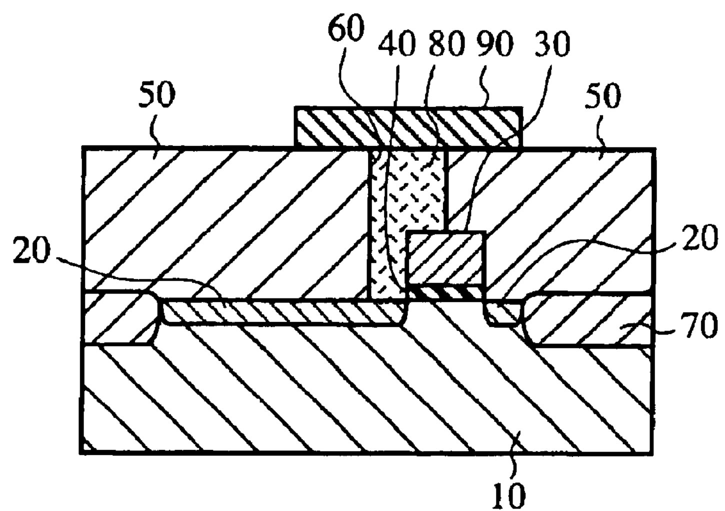
FIG. 5 is a sectional view taken along line B—B of FIG. 4.
Figure 6:
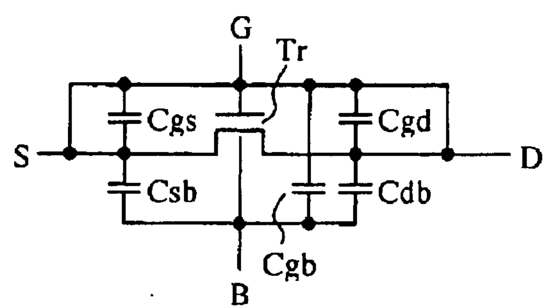
FIG. 6 is an equivalent circuit diagram thereof.

FIG. 4 is a plan view showing the structure of the common contact hole 60 of Embodiment 2 of the present invention. FIG. 5 is a sectional view taken along line B—B of FIG. 4. FIG. 6 is an equivalent circuit diagram thereof. The same portions as those of FIGS. 1–3 are designated by similar numerals for avoiding redundant descriptions.

Referring to FIG. 4, forming the gate electrode 30 halfway through the device area performs the formation of the diffused layer 20 within one area. The structure except this feature is the same as that of Embodiment 1, and the sectional structure is also the same.

As shown in the equivalent circuit diagram of FIG. 6, the diffused layer 20 is connected in common with the source terminal S and drain terminal D. In Embodiment 1, the drain terminal D is connected with the source terminal S when the transistor Tr is in conduction state; however, when the transistor Tr is out of conduction state, the drain terminal D is not connected with the source terminal S, and thereby the drain terminal D is in floating state. Since the values of the capacitance Cgd between gate and drain, and the capacitance Cdb between drain and substrate vary depending on the potential of the drain terminal D, the capacitance value fluctuates when the transistor Tr is out of conduction state and thereby the drain terminal D is put in floating state. Embodiment 1 is unsuitable for the addition of the capacitance having an accurate value.

As mentioned above, according to Embodiment 2, connecting in common the gate terminal G, source terminal S, and drain terminal D eliminates floating terminals, and thereby enables the addition of the capacitance having an accurate value.

Embodiment 3.

Figure 7:
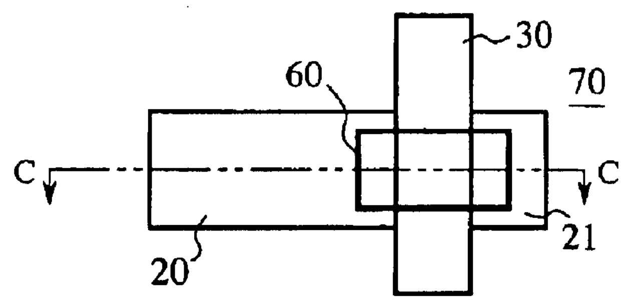
FIG. 7 is a plan view showing the structure of the common contact hole 60 of Embodiment 3 of the present invention.
Figure 8:
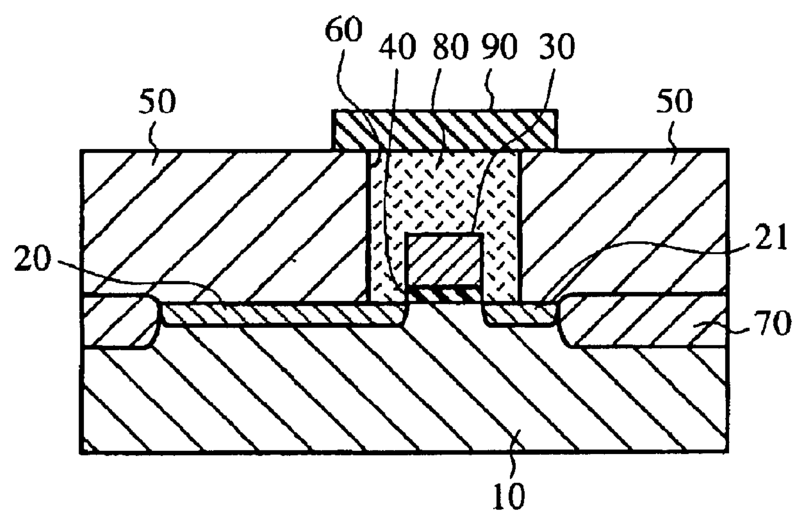
FIG. 8 is a sectional view taken along line C—C of FIG. 7.
Figure 9:
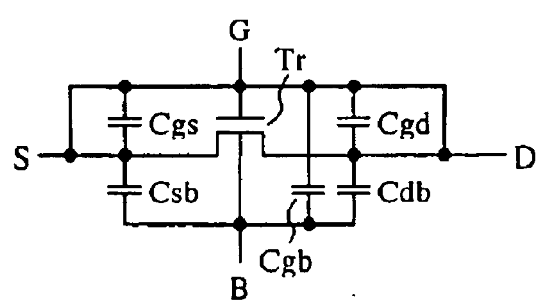
FIG. 9 is an equivalent circuit diagram thereof.

FIG. 7 is a plan view showing the structure of the common contact hole 60 of Embodiment 3 of the present invention. FIG. 8 is a sectional view taken along line C—C of FIG. 7. FIG. 9 is an equivalent circuit diagram thereof. The same portions as those of FIGS. 1–3 are designated by similar numerals for avoiding redundant descriptions.

Referring to FIG. 7, the common contact hole 60 is opened such that the hole spans the gate electrode 30 and the two diffused layers, that is, first and second diffused layers 20 and 21. The structure except this feature is the same as that of Embodiment 1, and the equivalent circuit is the same as that of Embodiment 2. In Embodiment 2, forming one diffused layer by means of expansion of the diffused layer electrically connects the source terminal S and drain terminal D; however, in Embodiment 3, expanding common contact hole 60 connects the source terminal S and drain terminal D.

As mentioned above, according to Embodiment 3, eliminating the floating terminals not only enables the addition of the capacitance having an accurate value, but also enables the connection of the gate terminal G, source terminal S, and drain terminal D with a smaller area increase in comparison with Embodiment 2.

Embodiment 4.

Figure 10:
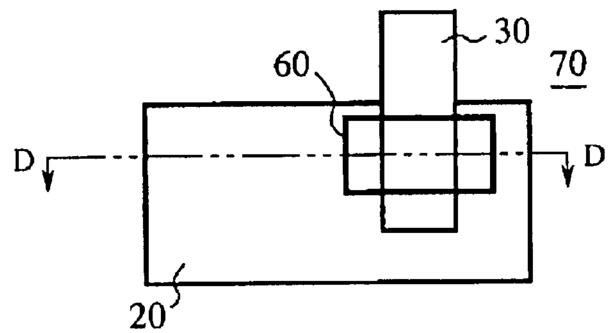
FIG. 10 is a plan view showing the structure of the common contact hole 60 of Embodiment 4 of the present invention.
Figure 11:
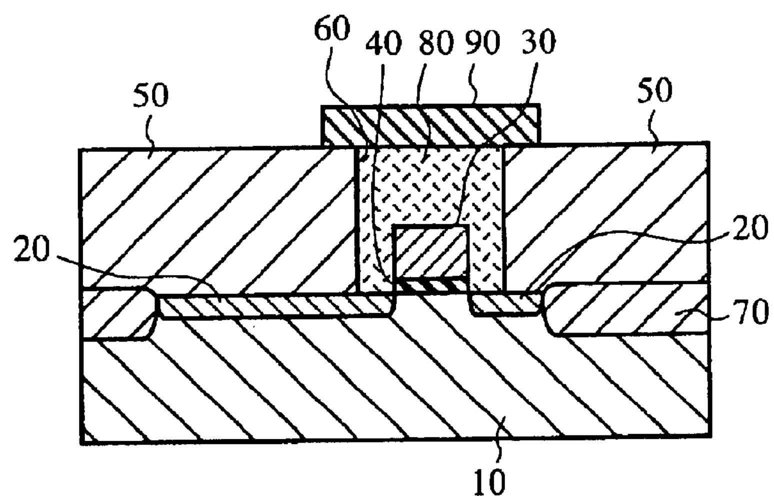
FIG. 11 is a sectional view taken along line D—D of FIG. 10.
Figure 12:
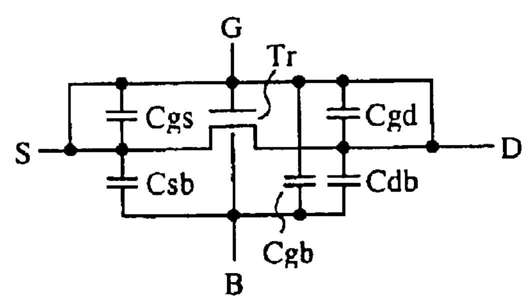
FIG. 12 is an equivalent circuit diagram thereof.

FIG. 10 is a plan view showing the example of combining Embodiment 2 and Embodiment 3. FIG. 11 is a sectional view taken along line D—D of FIG. 10. FIG. 12 is an equivalent circuit diagram thereof. There arises a possibility that in a small contact area, its resistance value varies greatly when the connection is done through only the common contact hole 60, or by only the diffused layer 20.

As mentioned above, according to Embodiment 4, since the connection is done by both the common contact hole 60 and diffused layer 20, the variation of resistance value may be suppressed.

Embodiment 5.

Figure 13:
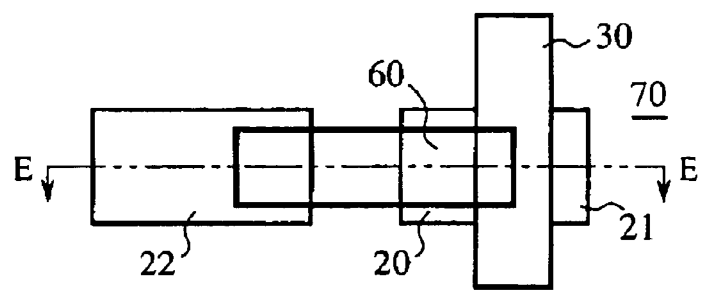
FIG. 13 is a plan view showing the structure of the common contact hole 60 of Embodiment 5 of the present invention.
Figure 14:
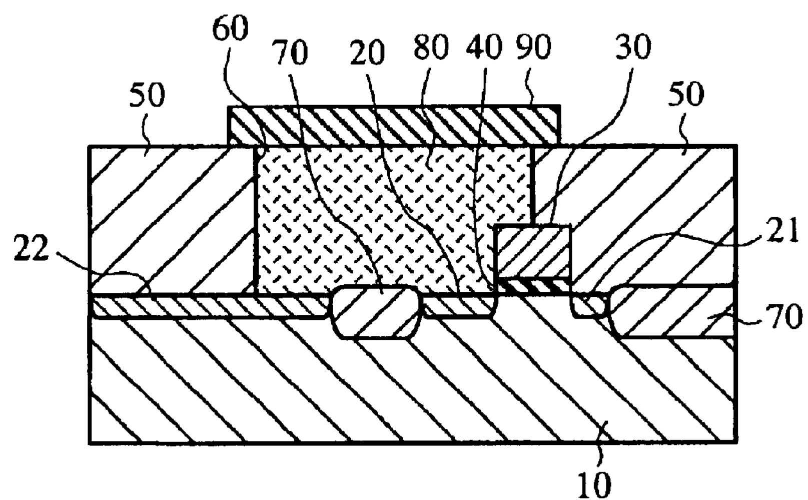
FIG. 14 is a sectional view taken along line E—E of FIG. 13.
Figure 15:
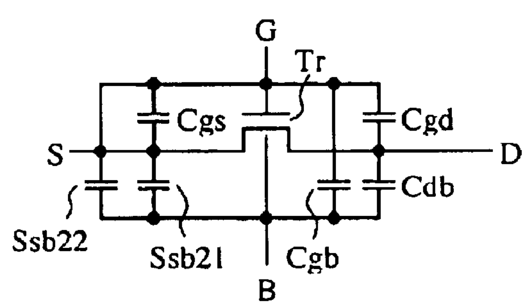
FIG. 15 is an equivalent circuit diagram thereof.

FIG. 13 is a plan view showing the structure of common contact hole 60 of Embodiment 5 of the present invention. FIG. 14 is a sectional view taken along line E—E of FIG. 13. FIG. 15 is an equivalent circuit diagram thereof. FIGS. 14 and 15 show the well area 10, first, second, and third diffused layers 20, 21, and 22, gate electrode 30, gate insulating film 40, interlayer film 50, contact hole 60, and isolation area 70.

The plan view of FIG. 13 will next be described. The device area separated by separating area 70 in a silicon substrate or well area 10 is formed, and the gate electrode 30 fabricated with polysilicon is formed such that the electrode extends from the isolation area 70 to divide the device area into two sections. The transistor Tr is formed in a portion where the gate electrode 30 and the device area overlap one another. The impurity-diffused layers 20, 21 and 22 are formed by implanting an impurity having a conduction type opposite to that of the well area 10. The third diffused layer 22 is separated from the first and second diffused layers 20 and 21 by the isolation area 70. The simple contact hole 60 is opened such that the hole spans gate electrode 30 and diffused layer 20.

The sectional view of FIG. 14 will next be described. The first, second, and third diffused layers 20, 21, and 22 are formed on the well area 10, separated by the isolation area 70. The bottom region of the gate electrode is electrically insulated from the well area through the thin insulating film 40. After the interlayer film 50 is formed such that the film covers the first, second, and third diffused layers 20, 21, and 22, isolation area 70, and gate electrode 30, the common contact hole 60 is opened such that the hole spans the electrode 30 and third diffused layer separated from the electrode 30 by the first diffused layer 20 and isolation area 70. Covering the common contact hole 60 with a metal such as aluminum or tungsten enables the electrical connection among the gate electrode 30, first and third diffused layers 20 and 22.

The equivalent circuit diagram of FIG. 15 will next be described. Since the transistor Tr is formed in a section where the gate electrode 30 and the device area overlap one another, the gate electrode 30, first and second diffused layers 20, 21, and well area 10 correspond to the gate terminal G, source terminal S, drain terminal D, and substrate B of transistor Tr, respectively. The common contact 60 electrically connects the gate terminal G and source terminal S. A parasitic capacitance exists between these terminals by coupling. That is, there exist a capacitance Cgs between gate and source, a capacitance Cgd between gate and drain, a capacitance Cgb between gate and substrate, a capacitance Csb between source and substrate, and a capacitance Cdb between drain and substrate.

In addition, since the source terminal S and drain terminal D correspond to the impurity-diffused layers that have the same structure, these terminals do not need to be especially distinguished. There is no problem that even if the first and second diffused layers 20 and 21 have an impurity implantation of conduction type opposite to that of the third diffused layer 22. For instance, when the conduction of the well area 10 is of n type, the impurity-diffused layers 20, 21, and 22 may be of p type; and impurity-diffused layers 20 and 21 may be p type and impurity-diffused layer 22 may be of n type. Moreover, there is no problem that even if the conduction of the well areas under the first and second diffused layers 20 and 21 are of type opposite to that of the well area under the third diffused layer 22. In that case, a p/n separation will exist in the separating area between the first diffused layer 20 and third diffused layer 22.

As mentioned above, according to Embodiment 5, since when connecting the gate electrode 30 and two diffused layers, first and second diffused layers 20, 22 separated by the separating area 70, it is possible to electrically connect them with the simple common contact hole 60, the number of common contact holes can be reduced and the occupied area can be thereby reduced. In addition, since forming transistor Tr under the common contact hole 60 enables the addition of the parasitic capacitance between the terminals of the transistor Tr to the connecting terminal, there exists an advantage that a capacitance element can be simultaneously formed.

Embodiment 6.

Figure 16:
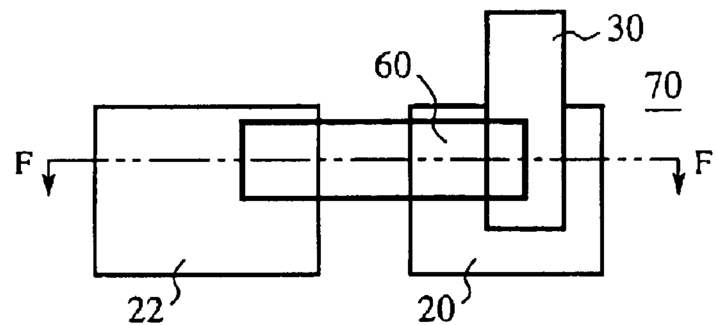
FIG. 16 is a plan view showing the structure of the common contact hole 60 of Embodiment 6 of the present invention.
Figure 17:
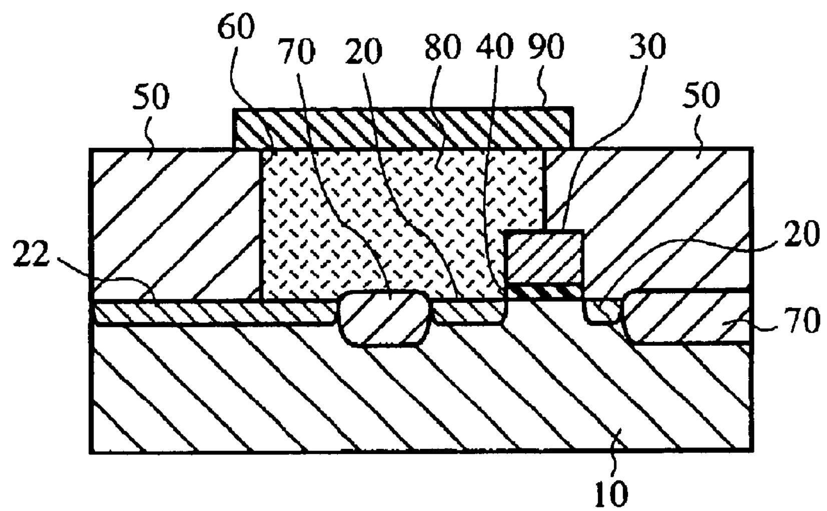
FIG. 17 is a sectional view taken along line F—F of FIG. 16.
Figure 18:
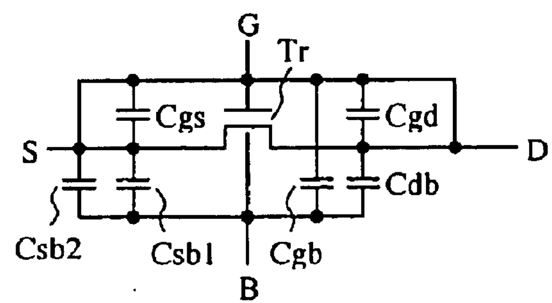
FIG. 18 is an equivalent circuit diagram thereof.

FIG. 16 is a plan view showing Embodiment 6 of the present invention as a modification of Embodiment 5. FIG. 17 is a sectional view taken along line F—F of FIG. 16. FIG. 18 is an equivalent circuit diagram thereof. As shown in Embodiment 2, the source and drain of the transistor Tr are formed within one diffused area.

As mentioned above, according to Embodiment 6, as in Embodiment 2, connecting in common the gate terminal G, source terminal S, and drain terminal D eliminates floating terminals and thereby enables the addition of the capacitance having an accurate value.

Embodiment 7.

Figure 19:
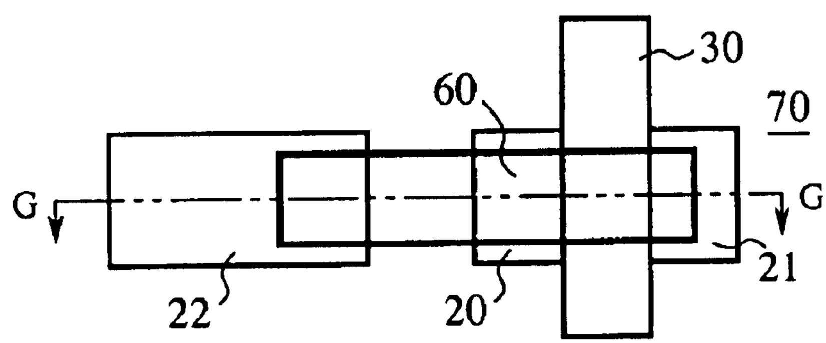
FIG. 19 is a plan view showing the structure of the common contact hole 60 of Embodiment 7 of the present invention.
Figure 20:
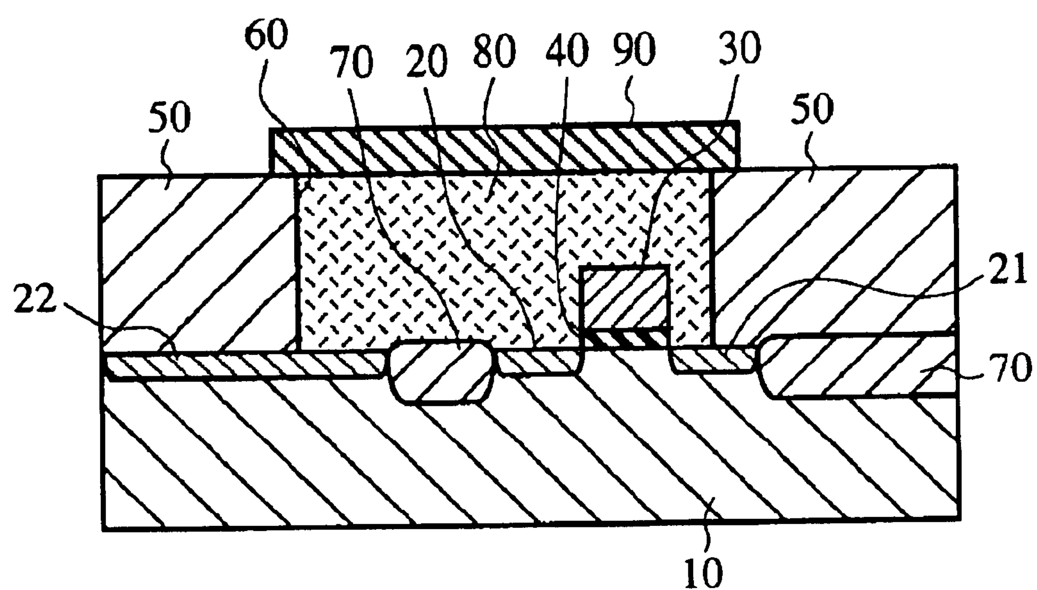
FIG. 20 is a sectional view taken along line G—G of FIG. 19.

FIG. 19 is a plan view showing Embodiment 7 of the present invention as a modification of Embodiment 5. FIG. 20 is a sectional view taken along line G—G of FIG. 19. The same portions as those of Embodiment 5 are designated by similar numerals for avoiding redundant descriptions.

Referring to FIGS. 19 and 20, the common contact hole 60 is opened such that the hole spans the gate electrode 30 and first, second, and third diffused layers 20, 21, and 22. The structure except this feature is the same as that of Embodiment 5, and the equivalent circuit is the same as that of Embodiment 15. In Embodiment 6, forming one diffused layer by means of expansion of the first diffused layer 20 electrically connects the source terminal S and drain terminal D; however, in Embodiment 7, expanding the common contact hole 60 connects the source terminal S and drain terminal D.

As mentioned above, according to Embodiment 7, as described in Embodiment 6, eliminating floating terminals not only enables the addition of the capacitance having an accurate value, but also enables the connection of the gate terminal G, source terminal S, and drain terminal D by use of smaller increase of space in comparison with Embodiment 6.

Embodiment 8.

Figure 21:
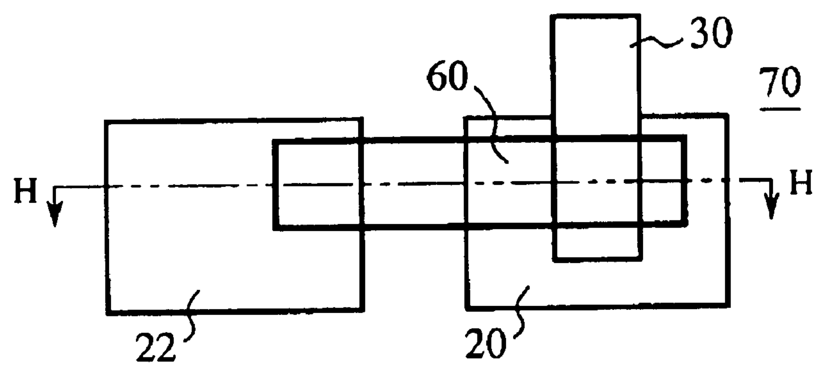
FIG. 21 is a plan view showing the structure of common contact hole 60 of Embodiment 8 of the present invention.
Figure 22:
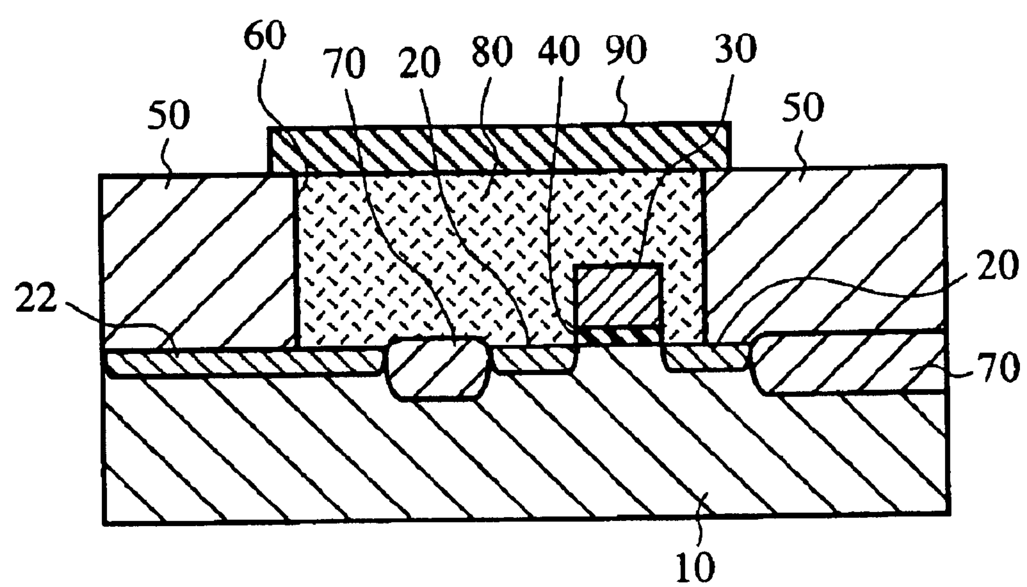
FIG. 22 is a sectional view taken along line H—H of FIG. 21.

FIG. 21 is a plan view showing Embodiment 8 of the present invention that is the combination of Embodiment 6 and Embodiment 7. FIG. 22 is a sectional view taken along line H—H of FIG. 21. The equivalent circuit diagram thereof is the same as FIG. 15. There arises a possibility that the resistance greatly changes in the case where the contact space is small when the connection is done by only common contact hole 60 or by only the diffused layers. Because the connection is done by use of both the common contact hole 60 and diffused layer 20, the variation of resistance can be suppressed.

Embodiment 9.

Figure 23:
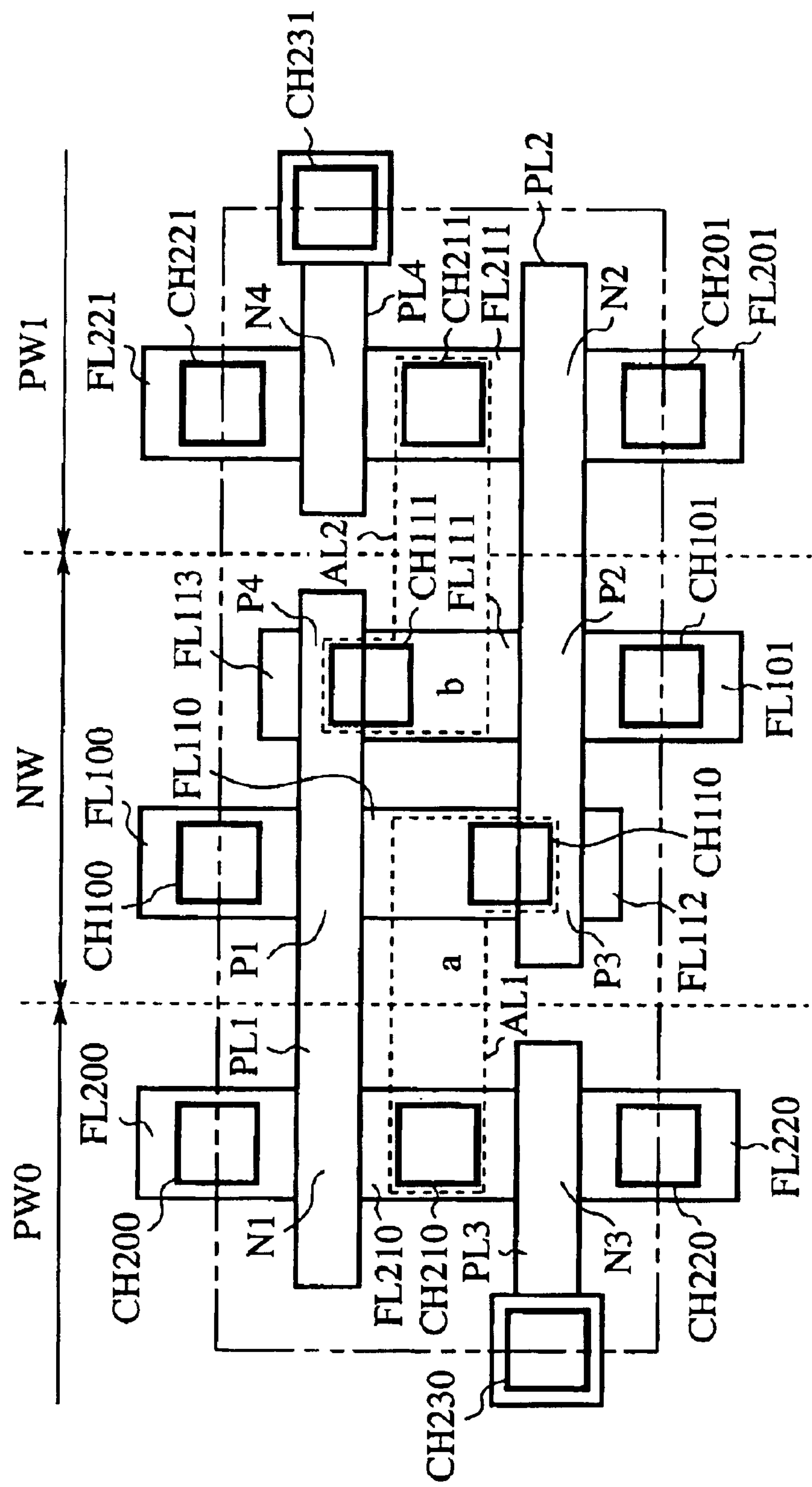
FIG. 23 is a layout plan view showing an SRAM memory cell of Embodiment 9 of the present invention.
Figure 24:
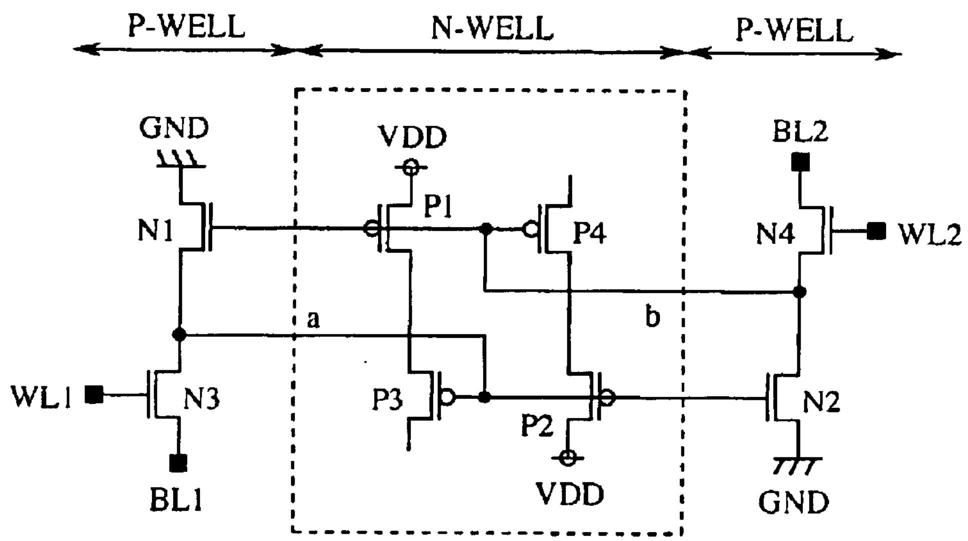
FIG. 24 is an equivalent circuit diagram thereof.

Embodiment 9 in which the common contact hole 60 according to the present invention is applied to a SRAM memory cell will next be described. FIG. 23 is a layout plan view showing the SRAM memory cell. FIG. 24 is an equivalent circuit diagram thereof. Shown in FIGS. 23 and 24 are P well areas PW0, PW1, N well area NW, $p^+$ diffused areas (or $n^+$ diffused areas) FL100, FL101, FL110, FL111, FL112, FL113, FL200, FL201, FL210, FL211, FL220, and FL221, polysilicon wiring layers PL1, PL2, PL3, and PL4, metal wirings AL1 and AL2, NMOS transistors N1, N2, N3, and N4, PMOS transistors P1, P2, P3, and P4, contact holes CH100, CH110, CH111, CH112, CH200, CH201, CH210, CH211, and CH221, power line VDD, grounding conductor GND, bit lines BL1 and BL2, word lines WL1 and WL2, and memory nodes a and b.

The circuit composition of the SRAM memory will first be described by way of the equivalent circuit shown in FIG. 24. First inverter is configured by use of NMOS transistor N1 and PMOS transistor P1, and second inverter is configured by use of NMOS transistor N2 and PMOS transistor P2.

One output terminal of the first and second inverters mutually connects with the other input terminal to thereby configure memory nodes a and b. The source, gate, and drain of NMOS transistor N3 are connected with one memory terminal a, word line WL1, and one bit line BL1, respectively. The source, gate, and drain of NMOS transistor N4 are connected with the other memory terminal b, word line WL2, and the other bit line BL2, respectively. P3 and P4 are PMOS transistors formed for adding capacitance. Gate terminal G and source terminal S of this PMOS transistor P3 are connected to memory terminal a. Gate terminal G and source terminal S of PMOS transistor P4 are connected to memory terminal b. The connection as mentioned above configures a SRAM memory cell circuit.

The layout configuration of the SRAM memory cell shown in layout plan view of FIG. 23 will next be described. Referring to the figure, one n type well area NW, and two p type well areas PW0 and PW1 are formed. As shown in the figure, PMOS transistors P1, P2, P3, and P4 are formed within one N well area NW.

The first and fourth NMOS transistors N1 and N4 are formed within one P well area PW0, and the second and third NMOS transistors N2 and N3 are formed within the other P well area PW1. The overlapped portion of diffused area FL and polysilicon wiring layer PL shown in the figure becomes a transistor.

Gate terminals G of PMOS transistor P1, P4, and NMOS transistor N1 are connected with memory terminal b together by common polysilicon wiring PL1. Gate terminals G of PMOS transistor P2 and P3, and NMOS transistor N2 are connected with memory terminal a together by common polysilicon wiring PL2. The implantation of p-type impurity into FL100, FL101, FL110, FL111, FL112, and FL113 within N well area NW forms $p^+$ diffused areas. The implantation of n-type impurity into FL200, FL201, FL210, FL211, FL220, and FL221 within P well areas PW0 and PW1 forms $n^+$ diffused areas.

$N^+$ diffused layer FL210 and $p^+$ diffused layer FL110 are electrically connected at low impedance to polysilicon wiring PL2 through common contact hole CH110, contact hole CH210, and metallic wiring AL1. This portion corresponds to one terminal a of the memory node shown in the equivalent circuit diagram of FIG. 24. $N^+$ diffused layer FL211 and $p^+$ diffused layer FL111 are electrically connected at low impedance to polysilicon wiring PL1 through common contact hole CH111, contact hole CH211, and metallic wiring AL2. This portion corresponds to the other terminal b of the memory node shown in the equivalent circuit diagram of FIG. 24.

$P^+$ diffusion areas FL100 and FL101 are connected to potential VDD through contact holes CH100 and CH101. Referring to FIG. 24, this portion corresponds to the sources of PMOS transistors P1 and P2. $N^+$ diffused layers FL200 and FL201 are connected to potential GND, through CH200 and CH201, respectively. Referring to FIG. 24, this portion corresponds to the sources of NMOS transistors N1 and N2. $N^+$ diffused layers FL220 and FL221 are connected to bit lines BL1 and BL2, respectively through contact holes CH220 and 221. Polysilicon wirings PL3 and PL4 are connected to word lines WL1 and WL2, respectively through contact holes CH230 and CH231. In addition, with regarding to the parameters of "film thickness," "relative dielectric constant," and "impurity concentration," PMOS transistors P3 and P4 should be different from only NMOS transistors N3 and N4 that are access transistors; and P1, P2, N3, and N4 may be the same as P3 and P4 as well as be different from P3 and P4.

As mentioned above, according to Embodiment 9, because the diffused area is connected with the polysilicon wiring by use of common contact holes CH110 and 111, the number of contacts necessary to compose the SRAM memory cell can be decreased, and the area can be thereby reduced. Forming PMOS transistors P3 and P4 within the portion of common contact holes CH110 and 111 enables the addition of capacitance to memory terminals a and b without the increase of the area.

As a result, even if the electrons generated by alpha rays etc. try to invert the data held in the memory node, because the potential change of memory node is delayed when the capacity of the memory terminal is large, the inversion of the data becomes difficult. In other words, the effect that the soft error resistance is improved is produced.

Embodiment 10.

Figure 26:
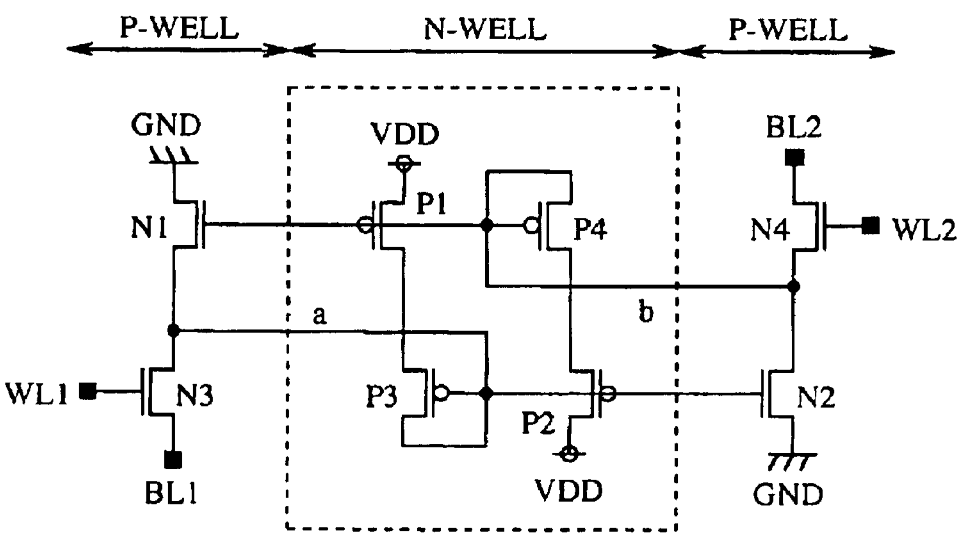
FIG. 26 is an equivalent circuit diagram thereof.
Figure 25:
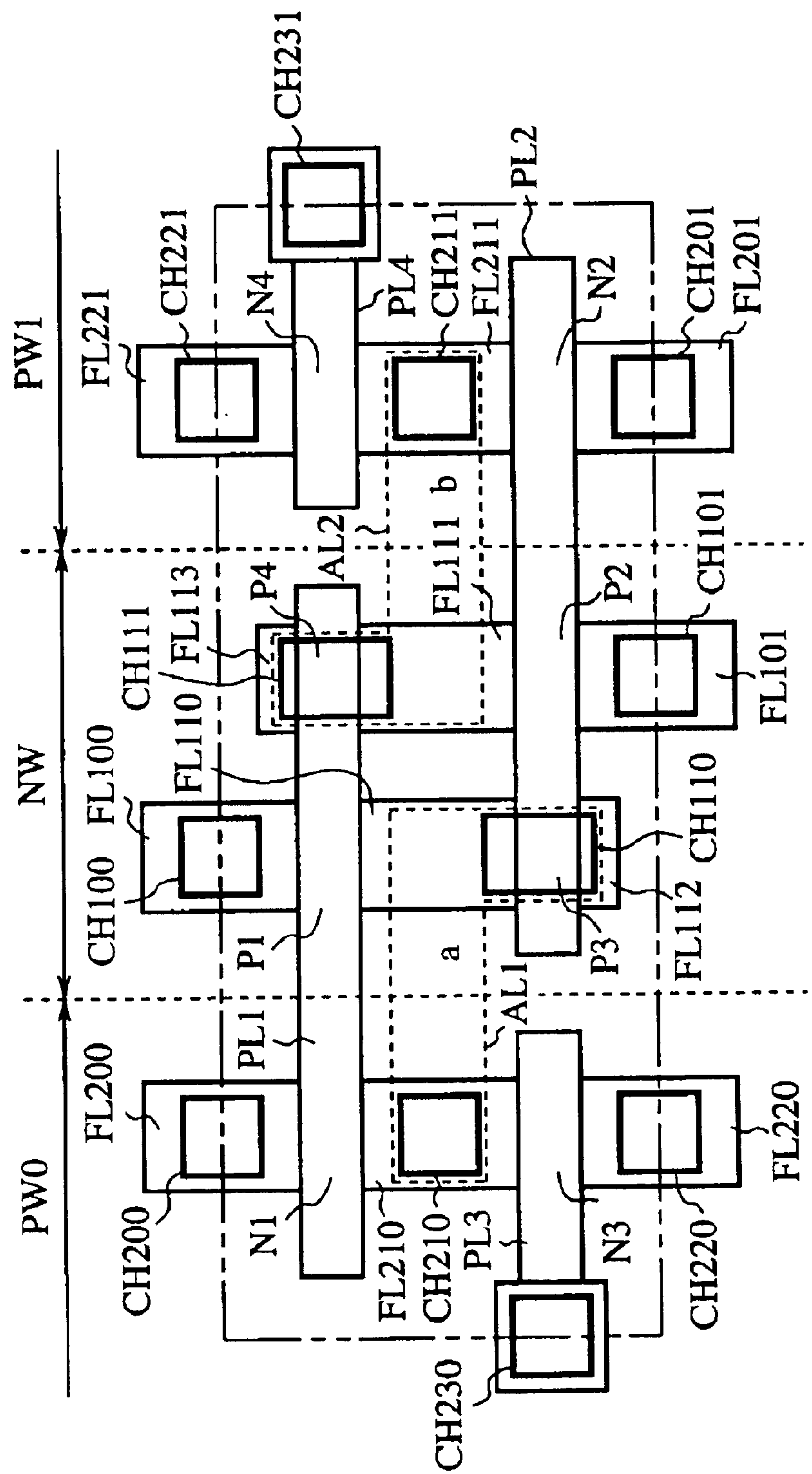
FIG. 25 is a layout plan view showing an SRAM memory cell of Embodiment 10 of the present invention.

Embodiment 10 that is another example in which the common contact hole 60 according to the present invention is applied to a SRAM memory cell will next be described. FIG. 25 is a layout plan view showing the SRAM memory cell. FIG. 26 is the equivalent circuit diagram thereof. The same portions as those of FIGS. 23 and 24 are designated by similar numerals for avoiding redundant descriptions.

The equivalent circuit diagram of FIG. 26 will first be described. The equivalent circuit diagram is the same as that shown in Embodiment 9 except that each gate terminal, source terminal, and drain terminal of PMOS transistors P3 and P4 added for the addition of capacity are connected in common, to memory terminals a and b.

Referring to FIG. 25, the layout configure will next be described. The layout configure is the same as the one of Embodiment 9 except that p type diffused layers FL110 and FL112, FL111 and FL113 were connected in common by means of expansion of common contact holes CH110 and CH111.

As mentioned above, according to Embodiment 10, because the floating terminal can be eliminated in addition to the effects shown in Embodiment 9, there exists the advantage that the accurate capacitance value can be added to memory terminals a and b.

Embodiment 11.

Figure 27:
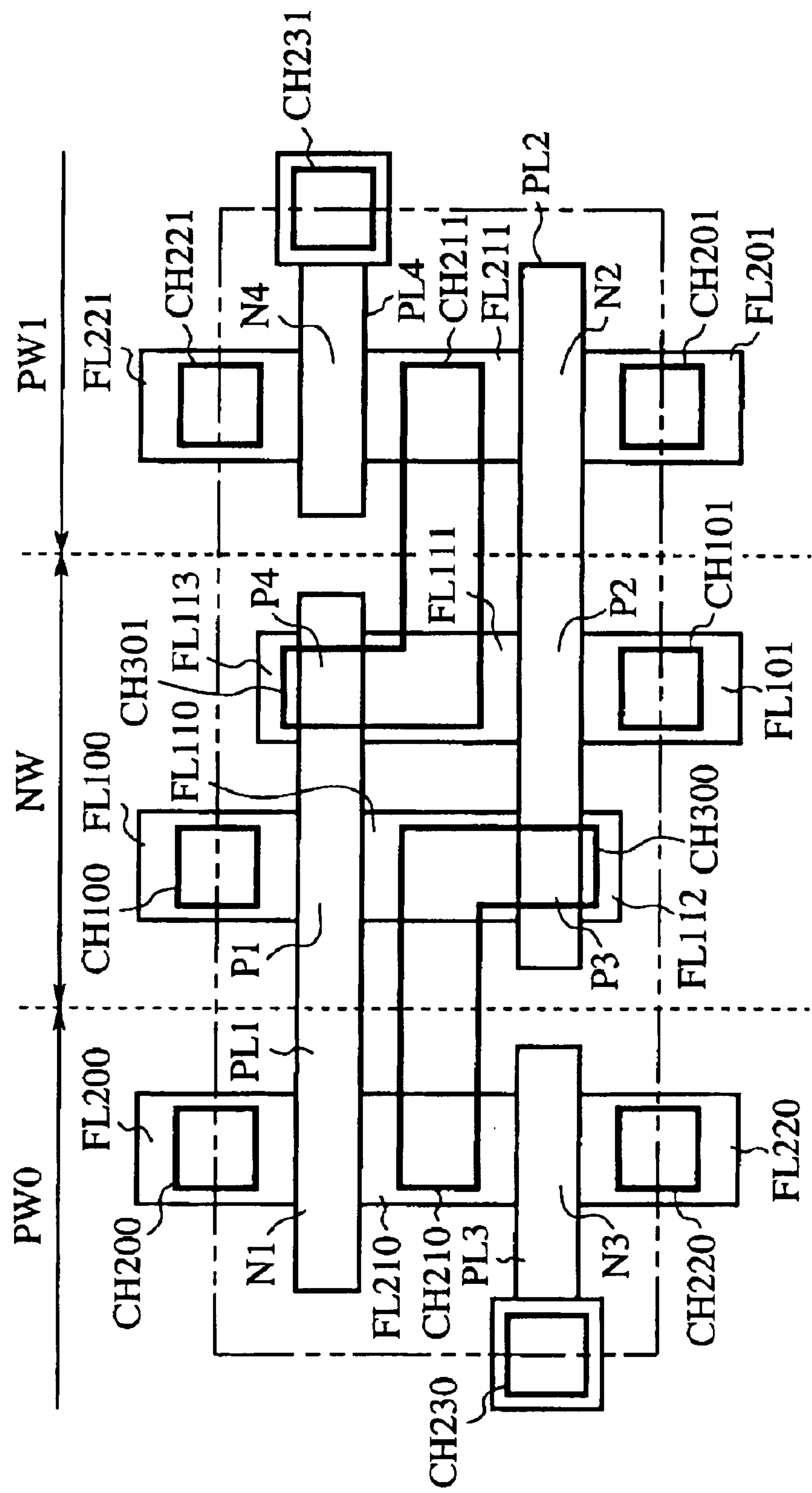
FIG. 27 is a layout plan view showing an SRAM memory cell of Embodiment 11 of the present invention.
Figure 28:
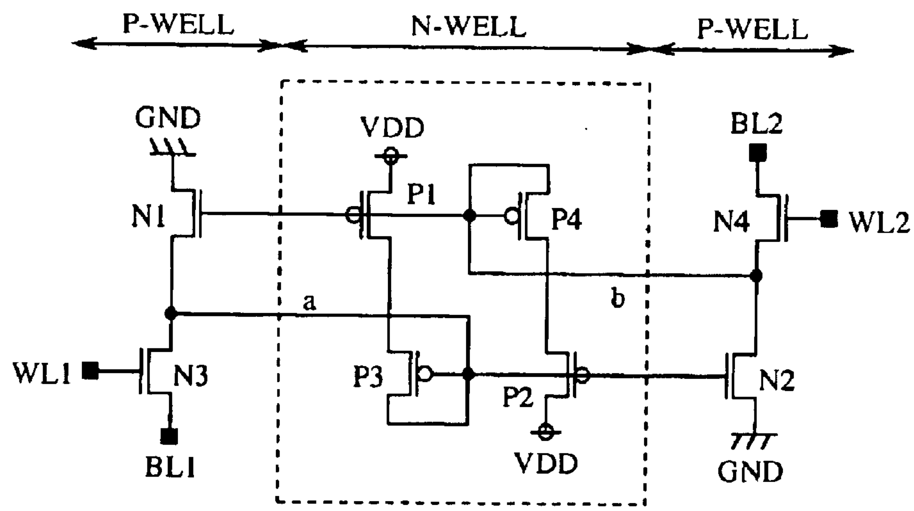
FIG. 28 is an equivalent circuit diagram thereof.

Embodiment 11 in which common contact hole of the present invention is applied to a SRAM memory cell will next be described. FIG. 27 is a layout plan view showing the SRAM memory cell. FIG. 28 is the equivalent circuit diagram thereof. The same portions as the ones of said FIGS. 23 and 24 of said Embodiment 9 are designated by similar numerals for avoiding overlaps.

Referring to the layout plan view of FIG. 27, common contact hole CH300 is formed such that the hole spans FL210, FL110, FL112, and polysilicon wiring PL2.

Moreover, common contact hole CH301 is formed such that the hole spans FL211, FL111, FL113, and polysilicon wiring PL1. $N^+$ diffused layer FL210, $p^+$ diffused layers FL110 and FL112 are electrically connected at low impedance to polysilicon wiring PL2 through common contact hole CH300. This portion corresponds to one terminal a of the memory node shown in the equivalent circuit diagram of FIG. 28. $N^+$ diffused layer FL211, $p^+$ diffused layers FL111 and FL119 are electrically connected at low impedance to polysilicon wiring PL1 through common contact hole CH301. This portion corresponds to the other terminal b of the memory node shown in the equivalent circuit diagram of FIG. 28.

As mentioned above, according to Embodiment 11, because the diffused area is connected to the polysilicon wiring by use of common contact holes CH300 and CH301, the number of contacts necessary to compose the SRAM memory cell can be decreased, and the area can be thereby reduced. Forming PMOS transistors P3 and P4 within the N well portion of common contact holes CH300 and CH301 enables the addition of capacitance to memory terminals a and b without the increase of the area.

As a result, even if the electrons generated by alpha rays etc. try to invert the data held in the memory node, because the potential change of memory node is delayed when the capacity of the memory terminal is large, the inversion of the data becomes difficult. In other words, the effect that the soft error resistance is improved is produced. Furthermore, because floating terminals can be eliminated, there exists the advantage that the accurate capacitance value can be added to memory terminals a and b.

Embodiment 12.

Figure 29:
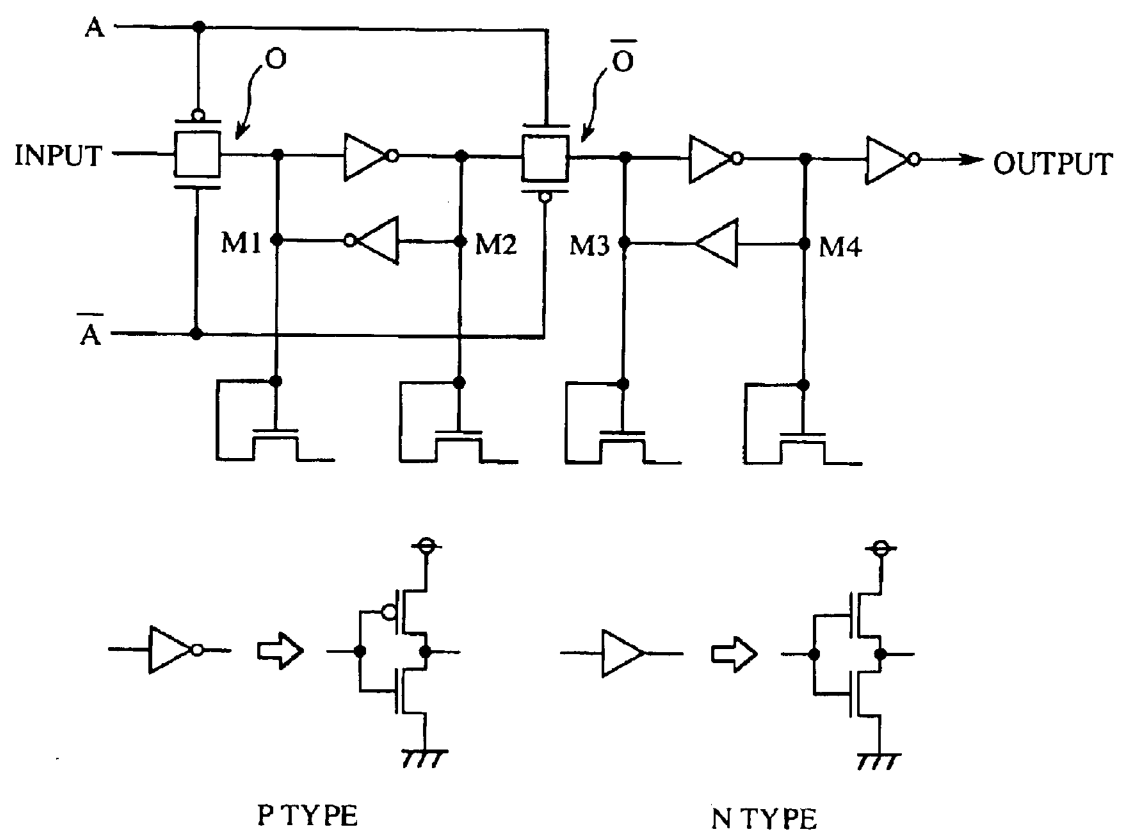
FIG. 29 is an equivalent circuit diagram of a bistable trigger circuit of Embodiment 12 of the present invention.
Figure 30:
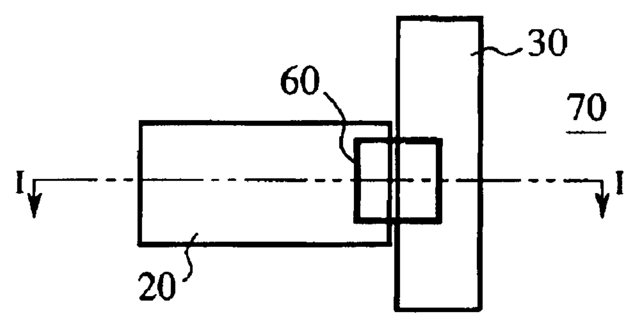
FIG. 30 is a plan view showing the structure of a common contact hole of the prior art.
Figure 31:
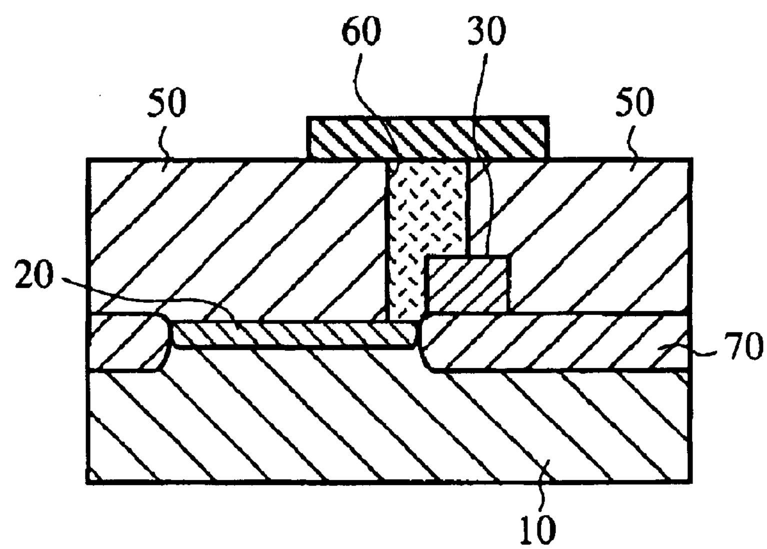
FIG. 31 is a sectional view taken along line I—I of FIG. 30.

The examples of application of the transistors for addition of capacitance shown in FIGS. 1–22 to the SRAM cell are shown in FIGS. 23–28. However, the transistors can be applied to, for instance, bistable trigger circuits, not only to the SRAM cell. The example of this bistable trigger circuit is shown in FIG. 29. Any transistor for addition of capacitance according to Embodiments 1–8 is connected to each one of memory nodes M1–M4 shown in the figure. Therefore, the embodiments have the advantage that is similar to the ones of the above-mentioned embodiments. A and A bar are clock signals having mutually complementary logic, and O and O bar are transfer gates. They mutually complementarily switch.

As mentioned above, according to the present invention, since a semiconductor device comprises a gate electrode formed on a substrate through a gate insulating film lying therebetween; a first and a second diffused layers formed opposed to each other across the portion of the substrate existing under the gate electrode and having a first conduction type, each having a second conduction type different from the first conduction type of the portion; a wiring layer formed above the gate electrode; and a contact formed within a contact hole between the wiring layer and the substrate, which connects the wiring layer to the first diffused layer and the gate electrode, the effect that not only a highly integrated SRAM memory is produced, but also the soft error resistance is improved is obtained.

According to the present invention, since the contact is connected also to the second diffused layer, the effect similar to the above-mentioned is obtained.

According to the present invention, since a semiconductor device comprises a third diffused layer formed on the substrate; and an isolation area formed between the first and the third diffused layers, which separates the first and the third diffused layers each other; and the contact is connected further to the third diffused layer, the effect that a floating terminal is eliminated, and that an accurate capacitance value can be added is obtained.

According to the present invention, since a semiconductor device comprises a gate electrode formed on a substrate through a gate insulating film; a diffused layer formed on the substrate; a wiring layer formed above the gate electrode; and a contact formed within a contact hole between the wiring layer and the substrate, which connects the wiring layer to the diffused layers and the gate electrode; wherein the diffused layer has: a first and a second portions formed opposed to each other across the portion of the substrate existing under the gate electrode and having a first conduction type, each having a second conduction type different from the first conduction type of the portion of the substrate; and a third portion that connects the first portion to the second portion, the effect that not only, a floating terminal is eliminated; an accurate capacitance value can be added, but also gate terminal G, source terminal S, and drain terminal D are connected by a small increase of space is obtained.

According to the present invention, since the contact is connected to the first and the second portions of the diffused layer, the effect similar to the above-mentioned is obtained.

According to the present invention, since a semiconductor device comprises another diffused layer formed on the substrate; an isolation area formed between the diffused layer and the other diffused layer, which separates the diffused layer and the other diffused layer; and the contact is connected further to the other diffused layer, the effect that the number of contacts necessary to compose the SRAM memory cell can be decreased, and that capacitance can be added to the memory terminal without the increase of the area is obtained.

According to the present invention, since a semiconductor device comprises a SRAM cell, and the wiring layer that is connected to the memory node of the SRAM cell, the effect that a capacitance element can be simultaneously formed is obtained.

According to the present invention, since a semiconductor device comprises a bistable trigger circuit, and the wiring layer is connected to the memory node of the bistable trigger circuit, the effect similar to the above-mentioned is obtained.

According to the present invention, since a semiconductor device comprises another gate electrode formed on the substrate through another gate insulating film, and a transistor for composing a semiconductor integrated circuit (IC) therein, and the film thickness of the gate insulating film is thinner than the one of the other gate insulating film, the effect that not only the additional capacitance can be increased, but also the increases of the leakage current and of the delay of a general transistor can be suppressed is obtained.

According to the present invention, since a semiconductor device comprises another gate electrode formed on the substrate through another gate insulating film, and a transistor for composing a semiconductor IC therein, and the relative dielectric constant of the gate insulating film is higher than the one of the other gate insulating film, the effect that not only the additional capacitance can be increased, but also the increase of the delay of a general transistor can be suppressed is obtained.

According to the present invention, since a semiconductor device comprises a source and a drain areas formed opposed to each other across the channel portion of the substrate existing under the gate electrode, and a transistor for composing a semiconductor IC therein, and the impurity concentrations of the first and the second diffused layers are higher than the ones of the source and the drain areas, the effect that not only the additional capacitance can be increased, but also the increase of the delay of a general transistor can be suppressed is obtained.

According to the present invention, since a semiconductor device comprises: a source and a drain areas formed opposed to each other across the channel portion of the substrate existing under the gate electrode, and a transistor for composing a semiconductor IC therein, and the impurity concentration of the diffused layer is higher than the ones of the source and the drain areas, the effect similar to the above-mentioned is obtained.

What is claimed is:

1. A semiconductor device, comprising:

a gate electrode formed on a substrate through a gate insulating film lying therebetween;

first and second diffused layers formed opposite to each other across the portion of the substrate existing under the gate electrode and having a first conduction type, each having a second conduction type different from the first conduction type of the portion;

a wiring layer formed above the gate electrode;

a contact hole formed between the wiring layer and the substrate, said contact hole having a width which spans the gate electrode and the first diffused layer;

a contact formed within the contact hole and electrically connecting the wiring layer to the first diffused layer and to the gate electrode, another gate electrode formed on the substrate through another gate insulating film; and a transistor for composing a semiconductor IC therein, wherein the relative dielectric constant of the gate insulating film is higher than the one of said another gate insulating film.

2. A semiconductor device according to claim 1, wherein the contact is connected also to the second diffused layer.

3. A semiconductor device according to claim 1, comprising:

a third diffused layer formed on the substrate; and an isolation area formed between the first and the third diffused layers, which separates the first and the third diffused layers from each other;

wherein the contact is connected further to the third diffused layer.

4. A semiconductor device according to claim 1, comprising a SRAM cell, wherein the wiring layer is connected to a memory node of the SRAM cell.

5. A semiconductor device according to claim 1, comprising a bistable trigger circuit, wherein the wiring layer is connected to the memory node of the bistable trigger circuit.

6. A semiconductor device according to claim 1, comprising: another gate electrode formed on the substrate through another gate insulating film, and a transistor for composing a semiconductor integrated circuit therein, wherein the film thickness of the gate insulating film is thinner than the one of the other gate insulating film.

7. A semiconductor device according to claim 1, comprising a source area and a drain area formed opposed to each other across a channel portion of the substrate existing under the gate electrode, and a transistor for composing a semiconductor IC therein, wherein the impurity concentrations of the first diffused layer and the second diffused layer are higher than the ones of the source and the drain areas.

8. A semiconductor device, comprising:

a gate electrode formed on a substrate through a gate insulating film;

a diffused layer formed on the substrate;

a wiring layer formed above the gate electrode;

a contact hole formed between the wiring layer and the substrate, the contact hole having a width which spans the gate electrode and the diffused layer;

a contact formed within the contact hole, electrically connecting the wiring layer to the diffused layer and to the gate electrode;

a source area and a drain area formed opposed to each other across the channel portion of the substrate existing under the aate electrode; and a transistor for composing a semiconductor IC therein, wherein the diffused layer has first and second portions formed opposite to each other across the portion of the substrate existing under the gate electrode and having a first conduction type, each having a second conduction type different from the first conduction type of the portion of the substrate; and a third portion that connects the first portion to the second portion, wherein the impurity concentration of the diffused layer is higher than the impurity concentration of the source area and the drain area.

9. A semiconductor device according to claim 8, wherein the contact is connected to the first portion and the second portion of the diffused layer.

10. A semiconductor device according to claim 4, comprising:

another diffused layer formed on the substrate; and an isolation area formed between the diffused layer and said other diffused layer, which separates the diffused layer and the other diffused layer, wherein the contact is connected further to the other diffused layer.

11. A semiconductor device according to claim 8, comprising a SRAM cell, wherein the wiring layer is connected to a memory node of the SRAM cell.

12. A semiconductor device according to claim 8, comprising a bistable trigger circuit, wherein the wiring layer is connected to the memory node of the bistable trigger circuit.

13. A semiconductor device according to claim 8, comprising: another gate electrode formed on the substrate through another gate insulating film, and a transistor for composing a semiconductor integrated circuit therein, wherein the film thickness of the gate insulating film is thinner than the one of the other gate insulating film.

14. A semiconductor device according to claim 8, comprising another gate electrode formed on the substrate through another gate insulating film, and a transistor for composing a semiconductor IC therein, wherein the relative dielectric constant of the gate insulating film is higher than the one of the other gate insulating film.

* * * * *

UNITED STATES PATENT AND TRADEMARK OFFICE

CERTIFICATE OF CORRECTION

PATENT NO. : 6,818,932 B2

DATED : November 16, 2004

INVENTOR(S) : Koji Nii et al.

It is certified that error appears in the above-identified patent and that said Letters Patent is hereby corrected as shown below:

Column 14,
Line 24, delete "the aate" and insert -- the gate --.
Line 39, delete "claim 4" and insert -- claim 8 --.

Signed and Sealed this

Twenty-eighth Day of June, 2005

JON W. DUDAS
*Director of the United States Patent and Trademark Office*